(12) United States Patent
Mi et al.

(10) Patent No.: US 10,312,082 B2
(45) Date of Patent: Jun. 4, 2019

(54) METAL BASED NANOWIRE TUNNEL JUNCTIONS

(71) Applicant: REGENTS OF THE UNIVERSITY OF MICHIGAN, Ann Arbor, MI (US)

(72) Inventors: Zetian Mi, Verdun (CA); Sharif Sadaf, Hamilton (CA); Yong-Ho Ra, Montreal (CA); Thomas Szkopek, Outremont (CA)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 15/590,768

(22) Filed: May 9, 2017

(65) Prior Publication Data

US 2017/0323788 A1 Nov. 9, 2017

Related U.S. Application Data

(60) Provisional application No. 62/333,445, filed on May 9, 2016.

(51) Int. Cl.

| | | |
|---|---|---|
| *H01L 33/06* | (2010.01) | |
| *H01L 21/02* | (2006.01) | |
| *H01L 27/15* | (2006.01) | |
| *H01L 33/00* | (2010.01) | |
| *H01L 31/109* | (2006.01) | |
| *H01L 33/32* | (2010.01) | |

(52) U.S. Cl.
CPC ...... *H01L 21/02603* (2013.01); *H01L 27/153* (2013.01); *H01L 33/002* (2013.01); *H01L 33/06* (2013.01); *H01L 31/109* (2013.01); *H01L 33/32* (2013.01); *Y10S 977/762* (2013.01)

(58) Field of Classification Search
CPC . H01L 21/02603; H01L 33/002; H01L 33/06; H01L 33/32; H01L 33/405; Y10S 977/762
See application file for complete search history.

(56) References Cited

U.S. PATENT DOCUMENTS

| | | | | |
|---|---|---|---|---|
| 2007/0227588 A1* | 10/2007 | Gossard | .............. | H01L 31/0352 136/255 |
| 2010/0148149 A1* | 6/2010 | Pedersen | ................ | H01L 33/24 257/13 |
| 2015/0155374 A1* | 6/2015 | Byun | ................ | H01L 29/66977 257/192 |

* cited by examiner

*Primary Examiner* — Stephen W Smoot

(57) ABSTRACT

Semiconductor light emitting diodes (LEDs) formed as (Al)GaN-based nanowire structures have a first semiconductor layer, a second semiconductor layer, and a thin metallic layer fabricated therebetween. The structures, operating in the deep ultraviolet (UV) spectral range, exhibit high photoluminescence efficiency at room temperature. The structures may be formed of an epitaxial metal tunnel junction operating as a reflector that enhances carrier transport to and from the semiconductor alloy layers, capable of producing external quantum efficiencies at least one order of magnitude higher than convention devices.

13 Claims, 13 Drawing Sheets

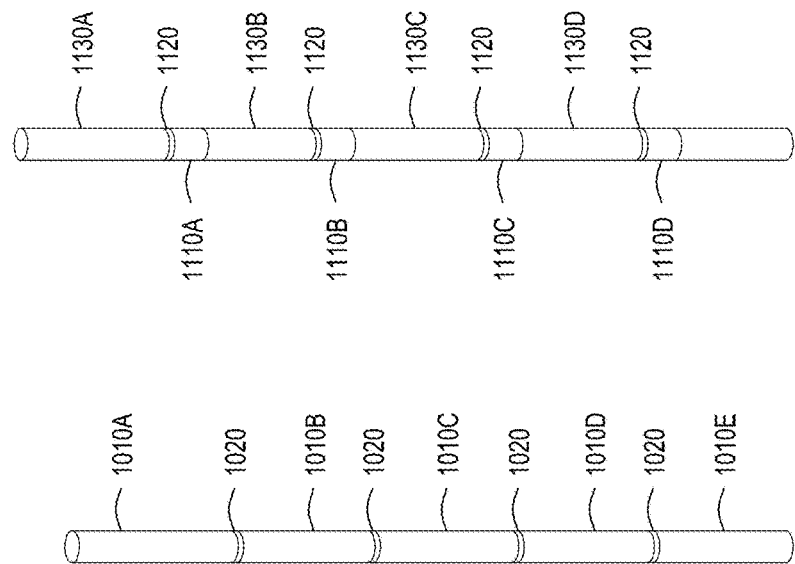
FIG. 11
FIG. 10
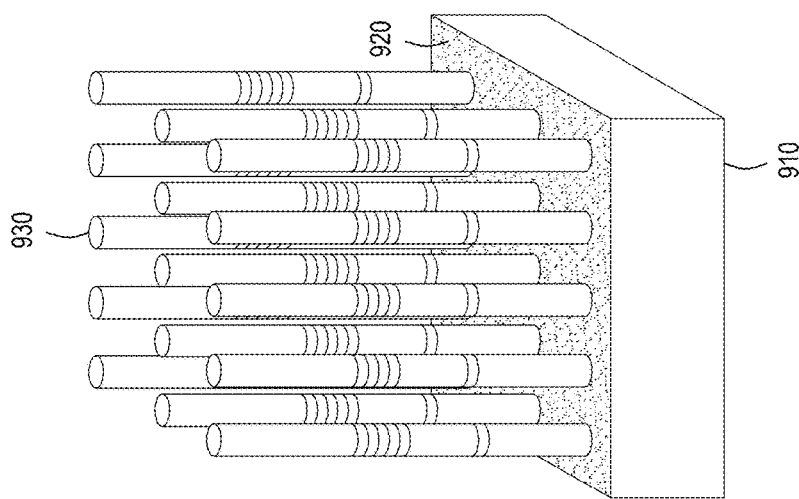
FIG. 9

METAL BASED NANOWIRE TUNNEL JUNCTIONS

CROSS-REFERENCE TO RELATED APPLICATION

This application claims the benefit of U.S. Application Ser. No. 62/333,445, filed May 9, 2016, entitled "Metal Based Nanowire Tunnel Junctions," which is hereby incorporated by reference in its entirety.

STATEMENT OF GOVERNMENT INTEREST

This invention was made with government support under W911NF-15-1-0168 awarded by the US Army Research Office. The Government has certain rights in the invention.

FIELD OF THE INVENTION

This invention relates to nanowire devices and more particularly to the use of an epitaxial metal layer as a tunnel junction discretely, as a combined tunnel junction and optical emitter reflective facet, and the basis of metal and semiconductor nanowire heterojunctions for multi-functional nanoscale electronic and photonic devices.

BACKGROUND OF THE INVENTION

A tunnel junction is a barrier, such as a thin insulating layer or electric potential, between two electrically conducting materials. Electrons (or quasiparticles) pass through the barrier as, according to quantum mechanics, each electron has a non-zero wave amplitude in the barrier, and hence some probability of passing through the barrier. Accordingly, tunnel junctions have been employed within a broad range of electronic and optoelectronic devices. However, its application in wide bandgap devices, such as those exploiting GaN and AlN semiconductors, has been limited to date. These materials are of interest as mixture of GaN with In (InGaN) or Al (AlGaN) with a band gap dependent on the ratio of In or Al to GaN allows the manufacture of light-emitting diodes (LEDs) and lasers with colors that can go from red to ultra-violet (UV-A/UV-B; 280 nm $\leq \lambda \leq 400$ nm) whilst AlN with Ga LEDs and/or lasers can span into the deep ultra-violet (UV-C; 200 nm $\leq \lambda \leq 280$ nm).

However, to date, it has remained challenging to form an efficient tunnel junction using either AlN or GaN -based semiconductor materials. Now referring to FIG. 1A there is depicted the schematic energy band diagram of a conventional $n^{++}$-GaN/$p^{++}$-GaN tunnel junction (TJ). The inefficient p-type doping in GaN and AlN, due to the low acceptor ionization efficiency, leads to a large depletion region width (W, i.e. wide tunnel barrier thickness) that inhibits efficient inter-band tunneling. In this context, the inherent spontaneous and piezoelectric polarization of wurtzite GaN-based heterostructures has been exploited to enable efficient inter-band tunneling within the prior art. Several tunnel junction designs, including GaN/AlN/GaN, GaN/InGaN/GaN, AlGaN/InGaN, AlGaN/GaN, and GaN/InGaN have been demonstrated within the prior art. Although promising results have been achieved using these tunnel junctions in planar devices, it has remained challenging to incorporate these designs into emerging high efficiency nanowire structures. Due to the inherent strain relaxation, the polarization-induced sheet charge at the heterointerface of nanowire structures is significantly reduced. Consequently, polarization engineered tunnel junctions may exhibit a higher voltage drop in nanowire-based devices. In addition, the successful incorporation of such tunnel junctions by and large depends on the crystal polarity (N-face or Ga-face). Despite the reduction in tunnel barrier width over conventional tunnel junctions, the afore-described AlN/GaN and InGaN/GaN based tunnel junctions still suffer from comparatively low inter-band tunneling conduction as well as optical absorption loss. Alternatively, within the prior art, tunnel junction devices incorporating rare earth materials such as GdN or semi-metallic MnAs and ErAs nanoparticles have been demonstrated under forward and reverse bias, wherein tunneling is enhanced by the presence of mid-gap states.

However, it would be beneficial to provide designers of nanowire based electronic and photonic devices with tunnel junctions that do not require the incorporation of rare earth nanoparticles, exhibit low inter-band tunneling conduction or exhibit optical absorption loss. It would be further beneficial to provide designers with an intrinsic molecular beam epitaxy (MBE) compatible tunnel junction exploiting a metal based layer supporting use over a wide range of GaN and/or AlN compositions. Further, it would be beneficial, within photonic devices, for the metal based layer to reflect light emitted from the nanowire active region in direct contrast to the light absorption induced by polarization engineered tunnel junctions within the prior art such that high reflectivity in the visible and UV spectral range can improve device performance.

SUMMARY OF THE INVENTION

The present application describes techniques that are able to mitigate limitations in the prior art relating to nanowire devices and more particularly to the use of an epitaxial metal layer as a tunnel junction discretely, as a combined tunnel junction and optical emitter reflective facet, and the basis of metal and semiconductor nanowire heterojunctions for multi-functional nanoscale electronic and photonic devices.

In accordance with an embodiment, there is provided a semiconductor emitter comprising a tunnel junction comprising a metallic layer disposed between a first semiconductor alloy and a second semiconductor alloy; wherein the metallic layer also acts as a reflector within the semiconductor emitter.

In accordance with another embodiment, there is provided a semiconductor device comprising a tunnel junction comprising a first semiconductor alloy of a first predetermined composition, a layer of a predetermined metal of a second predetermined composition.

In accordance with an embodiment, there is provided a semiconductor device comprising a tunnel junction comprising a first layer formed from a first semiconductor alloy, a second layer formed from a second semiconductor layer, and a third layer formed from a metal disposed between the first and second layers.

In accordance with another embodiment, there is provided a semiconductor device comprising a tunnel junction comprising a first layer formed from $n^{++}$-GaN , a second layer formed from $p^{++}$-GaN layer, and a third layer formed from Al disposed between the first and second layers.

BRIEF DESCRIPTION OF THE DRAWINGS

The figures described below depict various aspects of the system and methods disclosed herein. It should be understood that each figure depicts an example of aspects of the present systems and methods.

FIG. 9 depicts patterning of a metallized layer as template for nanowire growth and enhanced functionality/performance of the nanowire devices.

FIG. 10 depicts integration of metal layers within semiconductor nanowires for enhanced photon management and relaxed strain. and FIG. 11 depicts the integration of metal layers with quantum dots within semiconductor nanowires for enhanced device performance and functionality.

DETAILED DESCRIPTION

Figures 1A, 1B:
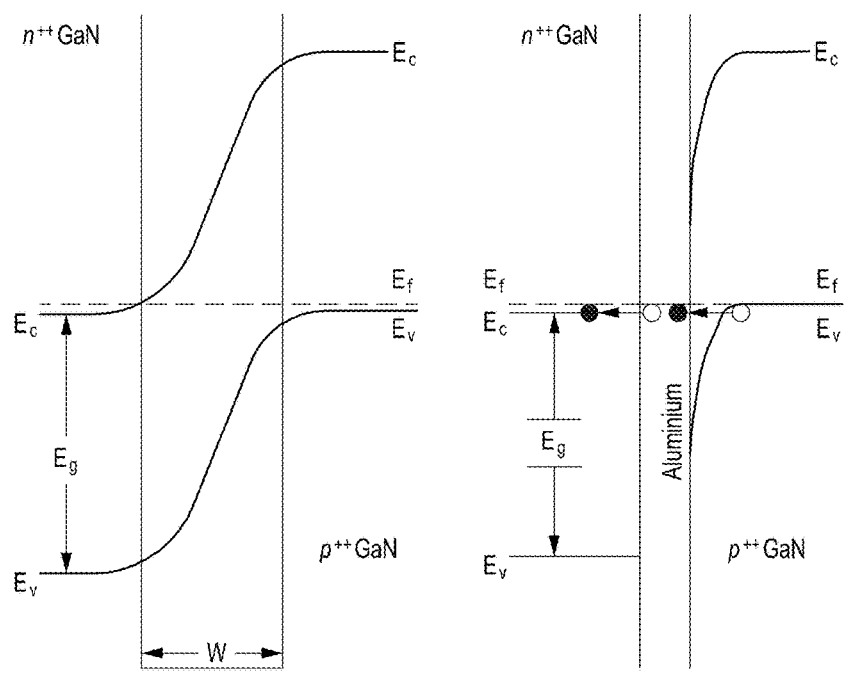
FIG. 1A depicts a schematic energy band diagram for a prior art $p^{++}/n^{++}$ GaN tunnel junction.
FIG. 1B depicts a schematic energy band diagram for a $n^{++}$-GaN/Al/$p^{++}$-GaN tunnel junction structure according to an embodiment of the invention.

The present techniques relate to nanowire devices and more particularly to the use of an epitaxial metal layer as a tunnel junction discretely, as a combined tunnel junction and optical emitter reflective facet, and the basis of metal and semiconductor nanowire heterojunctions for multi-functional nanoscale electronic and photonic devices.

The ensuing description provides example embodiment(s) only, and is not intended to limit the scope, applicability or configuration of the disclosure. Rather, the ensuing description of the embodiment(s) will provide those skilled in the art with an enabling description for implementing an exemplary embodiment. It is being understood that various changes may be made in the function and arrangement of elements without departing from the spirit and scope as set forth in the appended claims.

A "solid state light source" (SSLS) as used herein refers to, but is not limited to, a type of lighting that uses semiconductor electroluminescent light emitting structures such as semiconductor junctions, p-n junctions, p-i-n junctions, quantum structures, quantum dots. Such structures can comprise single or multiple quantum structures and junctions to generate single or multiple wavelengths and combinations thereof. Such SSLS may include, but are not limited to, semiconductor light-emitting diodes (LEDs), semiconductor nanowire LEDs and nanowire electrochemical SSLS devices. Such devices exploit the recombination of electrons and holes within the device or within/upon the surface of the device thereby releasing energy in the form of photons.

A "diode" as used herein refers to, but is not limited to, a two-terminal electronic device, component, or region of a semiconductor device that has asymmetric conductance such that it has low resistance to current in one direction, and high resistance in the other.

A "light emitting diode" (LED) as used herein refers to, but is not limited to, a particular type of light emitting diode comprising a p-n junction or p-i-n junction which emits light when activated by an external electrical source providing electrical current through the terminals or contacts of the device.

A "semiconductor" as used herein refers to, but is not limited to, a material having an electrical conductivity value falling between that of a conductor and an insulator wherein the material may be an elemental materials or a compound material. A semiconductor may include, but not be limited to, an element, a binary alloy, a tertiary alloy, and a quaternary alloy. Structures formed from a semiconductor or semiconductors may comprise a single semiconductor material, two or more semiconductor materials, a semiconductor alloy of a single composition, a semiconductor alloy of two or more discrete compositions, and a semiconductor alloy graded from a first semiconductor alloy to a second semiconductor alloy. A semiconductor may be undoped (intrinsic), p-type doped, n-typed doped, graded in doping from a first doping level of one type to second doping level of the same type, or grading in doping from a first doping level of one type to a second doping level of a different type. Semiconductors may include, but are not limited to, III-V semiconductors, such as those between aluminum (Al), gallium (Ga), and indium (In) with nitrogen (N), phosphorous (P), arsenic (As) and tin (Sb), including for example GaN, GaP, GaAs, InP, InAs, AlN and AlAs; II-VI semiconductors; I-VII semiconductors; IV-VI semiconductors; IV-VI semiconductors; V-VI semiconductors; II-V semiconductors; and I-III-VI2 semiconductors; oxides; layered semiconductors; magnetic semiconductors; organic semiconductors; some group IV and VI elements and alloys such as silicon (Si), germanium (Ge), silicon germanium (SiGe) and silicon carbide (SiC); and charge-transfer complexes, either organic or inorganic.

A "metal" as used herein refers to, but is not limited to, a material (an element, compound, or alloy) that have good electrical and thermal conductivity as a result of readily losing outer shell electrons which generally provides a free flowing electron cloud. This may include, but not be limited to, gold, chromium, aluminum, silver, platinum, nickel, copper, rhodium, palladium, tungsten, palladium, and combinations of such materials A "transparent electrode" or "transparent contact" as used herein refers to, but is not limited to, a material having electrical conductivity and optical transparency over a predetermined wavelength range. Such transparent electrodes may include, but are not limited to, indium tin oxide (ITO, or tin-doped indium oxide) which is a solid solution of indium (III) oxide ($In_2O_3$) and tin (IV) oxide (SnO); carbon nanotube conductive coatings; graphene films; thin metal films or hybrid material alternatives, such as silver nanowires covered with graphene; inherently conductive polymers (ICPs) and conducting polymers, such as polyaniline and poly(3,4-ethylenedioxythiophene) polystyrene sulfonate (PEDOT:PSS); and amorphous transparent conducting oxides including, for example, aluminum, gallium or indium-doped zinc oxide (AZO, GZO or IZO).

A "quantum structure" as used herein refers to, but is not limited, to a semiconductor structure having physical dimensions in one or more axes that are small enough that the properties of electrons and/or holes are governed by quantum mechanical and/or quantum electrical properties. This may include, but not be limited to, a quantum dot which is a nanocrystal of a semiconductor material small enough that its excitons are confined in all three spatial dimensions, a quantum well wherein the excitons are confined in one dimension such that they may move in a planar layer, and a quantum wire wherein the excitons are confined in two dimensions. A "quantum structure" may include, but not be limited to, a discrete quantum structure such as a colloidal quantum dot, a discrete quantum wire such as a nanotube, a quantum structure within a semiconductor structure such as a quantum dot within a nanowire, a quantum structure within another quantum structure such as a quantum dot within a quantum well or quantum dot within another quantum dot.

A "substrate" as used herein refers to, but is not limited to, a surface upon which semiconductor structures, such as nanowires for example, may be grown. This may include, but not be limited, silicon, silica-on-silicon, silica, silica-on-polymer, glass, a metal, a ceramic, a polymer, or a combination thereof. The substrate may be flat and smooth, profiled, curved, concave, convex, patterned, etc.

A "nanostructure" as used herein refers to, but is not limited to, a structure having one or more dimensions at the nanometer level, which is typically between the lower and upper dimensions of 0.1 nm and 100 nm. Such structures, may include, nanotextured surfaces having one dimension on the nanoscale, nanotubes having two dimensions on the nanoscale, and nanoparticles having three dimensions on the nanoscale. Nanotextured surfaces may include, but not be limited, nano-grooves, nano-channels, and nano-ridges. Nanotubes may include structures having geometries resembling, but not be limited to, tubes, solid rods, whiskers, and rhomboids with square, rectangular, circular, elliptical, and polygonal cross-sections perpendicular to an axis of the nanotube. Nanoparticles may include structures having geometries representing, but not limited to, spheres, pyramids, and cubes. The cross-sectional geometry of nanotubes and nanoparticles may not be constant such that a nanostructure may taper in one or two dimensions.

A "nanowire" as used herein refers to, but is not limited to, a structure within the category of nanotubes by virtue of being nanoscale on two dimensions and solid cross-sectionally formed from one or more materials.

Metal Based Tunnel Junctions

The inventors have established a novel metal based tunnel junction for integration with semiconductor nanowires in order to address limitations within the prior art. For example, the inventors have established novel aluminum (Al) tunnel junctions that overcome some of the critical issues related to conventional GaN-based tunnel junction designs, including stress relaxation, wide depletion region, and light absorption, and hold promise for realizing low resistivity, high brightness III-nitride nanowire LEDs in the visible and deep ultraviolet spectral range. Moreover, the demonstration of monolithic integration of metal and semiconductor nanowire heterojunctions provides a seamless platform for realizing a broad range of multi-functional nanoscale electronic and photonic devices.

Accordingly, the inventors have established a monolithically integrated metal/semiconductor nanowire tunnel junction LED, wherein the tunnel junction consists of $n^{++}$-GaN/Al/$p^{++}$-GaN as described and depicted in respect of FIG. 1B. With a work function of 4.08 eV, Al metal can form an ohmic contact to n-GaN. The presence of defects at the Al/$p^{++}$-GaN interface, partly due to the very high Mg-doping ($N_A \sim X10^{20}$ $cm^{-3}$), results in deep energy levels, which can significantly enhance carrier transport from p-GaN to Al in a similar manner to conventional trap-assisted tunneling. Accordingly, the inventors noted that the epitaxial Al/$p^{++}$-GaN can exhibit quasi-ohmic contact characteristics, and consequently, the effective tunneling barrier width is minimized, thereby enabling efficient inter-band conduction from p-GaN to n-GaN through the Al interconnect.

The back-to-back Al quasi-ohmic/ohmic contacts to the $p^{++}$ and $n^{++}$-GaN layers eliminate the need for polarization engineering at the interface to shrink the depletion region for efficient tunneling. With the use of molecular beam epitaxy (MBE), the inventors have demonstrated the monolithic integration of nearly defect-free GaN/Al/GaN tunnel junction LED heterostructures. Unique to the metal-based, e.g. Al-based, tunnel junction is that the Al layer, with appropriate thickness, can serve as a mirror to reflect light emitted from the active region, given its high reflectivity (~90%) in the visible and UV spectral range. This is in direct contrast to the light absorption induced by polarization engineered tunnel junctions within the prior art. As will become evident below, the inventors have further shown that the incorporation of such a tunnel junction in InGaN/GaN dot-in-a-wire LEDs can lead to significantly improved light output power and lower operation voltage, compared to identical nanowire devices without the use of tunnel junctions or with the incorporation of $n^{++}$-GaN/$p^{++}$-GaN tunnel junctions.

Metal Based Tunnel Junction LED Structures and Reference LED

Figure 2A:
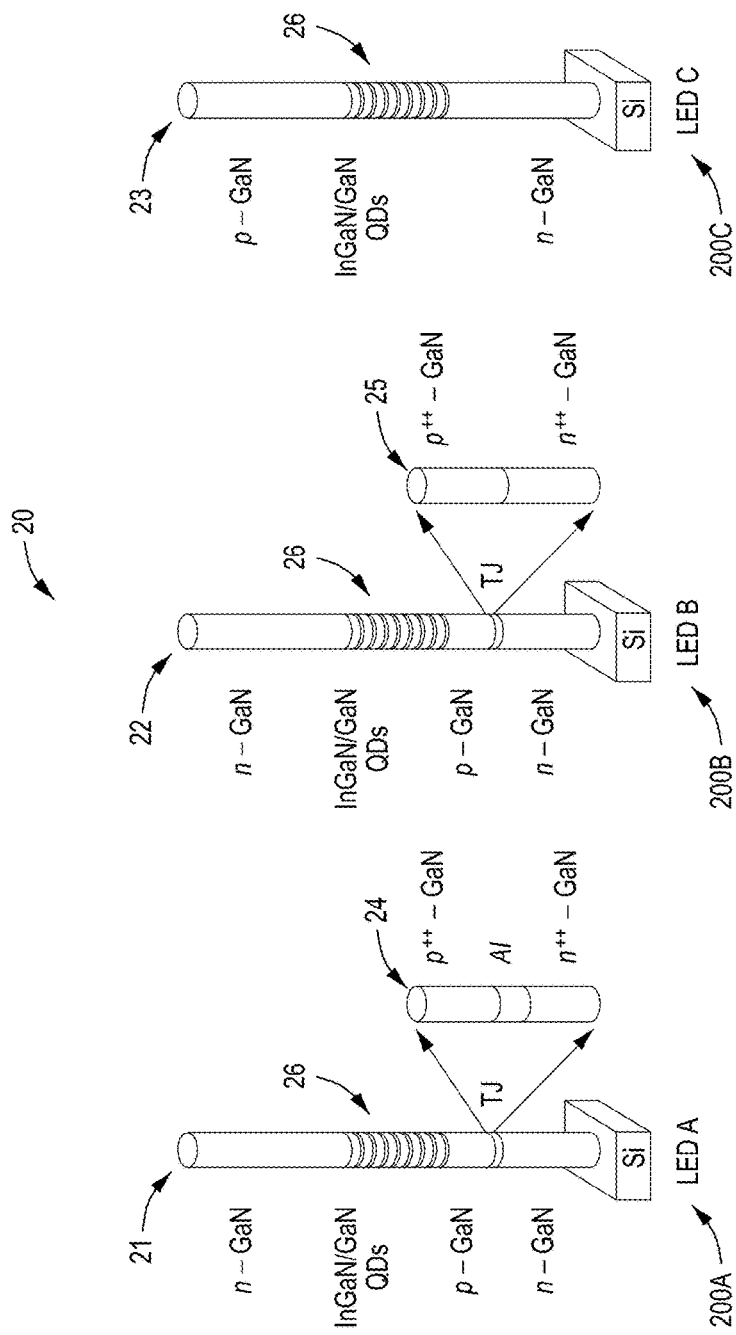
FIG. 2A depicts schematic diagrams for three different types of nanowire LED structures. These three types of nanowire LED structures include: an Al-interconnect tunnel junction (TJ) dot-in-a-wire LED (LED-A) according to an embodiment; a $n^{++}$-GaN I $p^{++}$-GaN TJ dot-in-a-wire LED (LED-B) according to an embodiment; and a prior art nanowire dot-in-a-wire LED (LED-C) without any TJ, all grown on a silicon (Si) substrate.

The inventors have implemented two metal based tunnel junction InGaN/GaN nanowires according to embodiments of the invention within the results described below together with a reference nanowire LED structure. These being:

LED-A 21: depicted in first schematic 200A in FIG. 2A comprising an $n^{++}$-GaN/Al/$p^{++}$-GaN tunnel junction LED 24;

LED-B 22: depicted in second schematic 200B in FIG. 2A comprising an $n^{++}$-GaN/$p^{++}$-GaN tunnel junction LED 25; and LED-C 23: depicted in third schematic 200C in FIG. 2A without any tunnel junction.

The tunnel junction of LED-A 24 includes $n^{++}$-GaN(7 nm)/Al(2 nm)/$p^{++}$-GaN(10 nm). The tunnel junction of LED-B 22 is identical to that of LED-A 21 but without the incorporation of the Al layer thereby yielding a tunnel junction design of $n^{++}$-GaN(7 nm)/$p^{++}$-GaN(10 nm) 25. In each design the active regions of each LED includes ten self-organized InGaN(3 nm)/GaN(3 nm) quantum dots 26. Each quantum dot layer is modulation doped p-type to enhance the hole injection and transport in the device active region as reported within the prior art by the inventors.

Nanowire Growth

In order to examine the intrinsic properties of the tunnel junction dot-in-a-wire LEDs, no AlGaN electron blocking layers were incorporated. All the LED structures were grown by plasma-assisted MBE on n-Si(111) substrates under nitrogen-rich conditions without using any external metal catalyst as reported by the inventors within the prior art. Prior to the growth, native oxide on the Si substrate was removed by hydrofluoric acid (10%), and further in situ desorbed at ~770° C. The $N_2$ flow rate was kept at 1.0 standard cubic centimeter per minute (sccm) with a forward plasma power of ~350 W during the growth. The substrate temperature was ~780° C. for n-GaN and 750° C. for p-GaN segments. Doping concentration and degeneracy in the tunnel junction were controlled by the Si (n-doping) and Mg (p-doping) effusion cell temperatures. The Al layer was grown at ~450° C. and was subsequently capped with a thin layer of Ga. In this process, the nitrogen plasma was turned off to avoid the formation of AlN. The substrate temperature was then increased to 650° C. for the growth of $p^{++}$-GaN(10 nm). Such optimum growth conditions were obtained based on extensive studies of the LED performance by varying the Al thickness (1 nm$\leq t_{al} \leq$6 nm) and growth temperature (300° C.$\leq T_{Growth} \leq$650° C.) and by changing the Si and Mg-doping concentrations. It was observed that a high quality pure Al metal layer could be grown in situ on GaN nanowires without any metal agglomeration and void formation. Moreover, detailed structural characterization, described below, further confirmed that defect-free nanowires could be grown directly on an epitaxial Al layer.

Figure 2C:
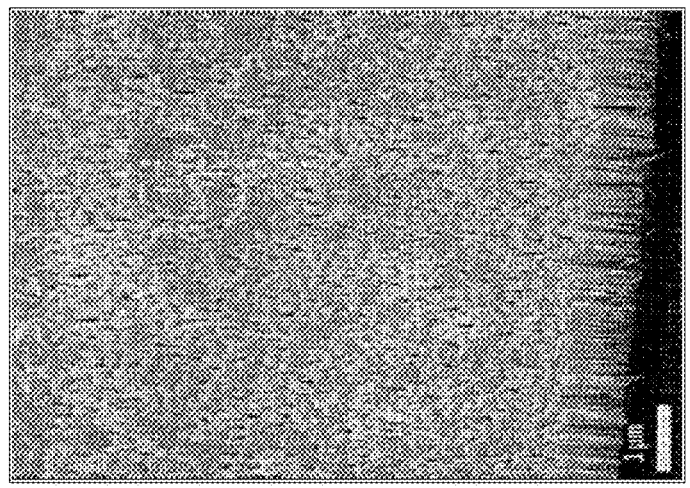
FIG. 2C depicts an SEM image of an Al-interconnect TJ dot-in-a-wire LEDs (LED A) according to an embodiment of the invention taken with a 45° angle.
Figure 2B:
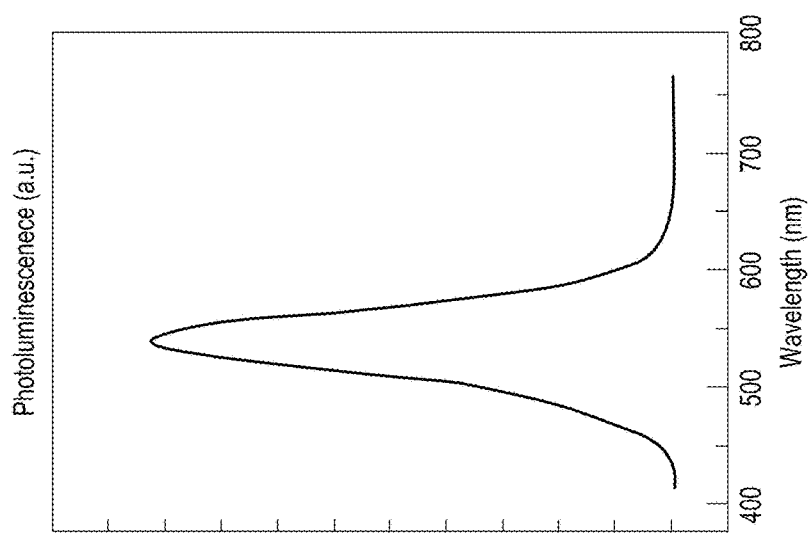
FIG. 2B depicts an exemplary photoluminescence (PL) spectra of an Al-interconnect TJ dot-in-a-wire LED (LED-A) according to an embodiment of the invention measured at room temperature.

The three nanowire LED structures exhibited nearly identical photoluminescence (PL) characteristics. Shown in FIG. 2B is the PL spectrum of LED-A measured at room temperature with a 405 nm laser excitation. A single PL emission peak at ~534 nm corresponds to emission from the quantum dot active region. Inhomogeneous broadening seen in the PL emission is largely due to In compositional variations inside the quantum dots. Structural properties of nanowire LEDs were characterized by field emission scanning electron microscopy (SEM). Shown in FIG. 2C is a 45° tilted image of the Al-based tunnel junction nanowire structure (LED-A).The nanowires are vertically aligned on the substrate, with diameters and densities in the range of 40 nm$\leq \phi \leq$100 nm and $1 \times 10^{10}$ cm$^{-2}$, respectively.

Nanowire LED Structure Characterization

Figure 3:
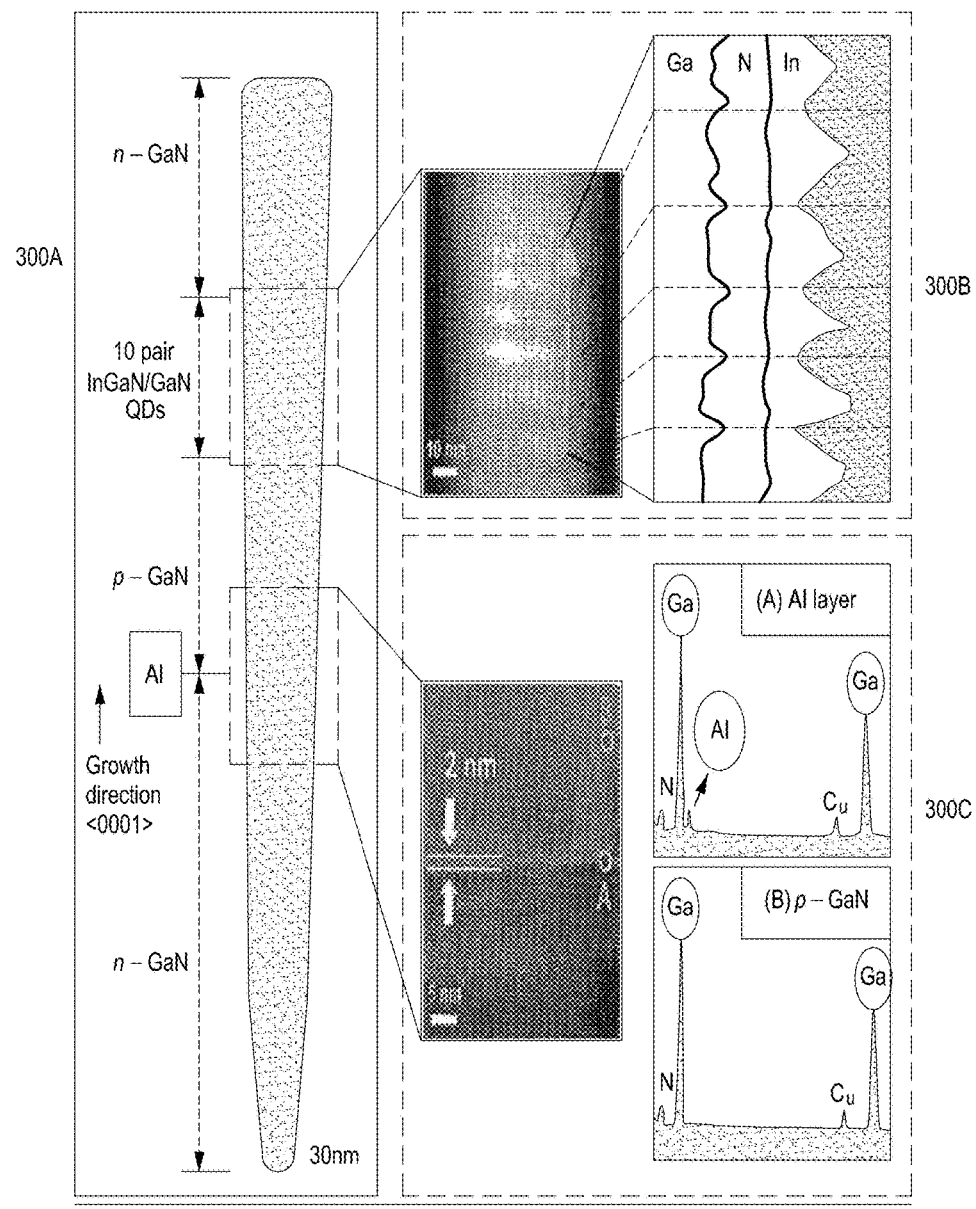
FIG. 3 depicts a STEM image of a single Al -interconnect tunnel nanowire LED structure (LED A) according to an embodiment of the invention together with an HAADF (upper left) and EDXS line profile (upper right) across the InGaN/GaN quantum dots and an HR-TEM image of the Al-interconnect tunnel junction (lower left) and EDXS point profiles (lower right) of the Al-interconnect tunnel junction region and p-GaN region.

Scanning transmission electron microscopy (STEM) and high resolution transmission electron microscopy (HR-TEM) studies were further performed to characterize the tunnel junction thickness and composition. The nanowires were first dispersed on a Cu grid. A JEOL JEM-2100F equipped with a field emission gun with an accelerating voltage of 200 kV was used to obtain bright-field TEM images. For STEM and high angle annular dark field (HAADF) imaging, the same equipment with a cold field emission emitter operated at 200 kV and with an electron beam diameter of approximately 0.1 nm was used. Illustrated in FIG. 3 in first image 300A is the STEM image of a tunnel junction nanowire structure, wherein the different segments can be clearly identified. It is seen that the InGaN/GaN quantum dots are positioned in the center of the nanowires due to the strain-induced self-organization. Also, no noticeable stacking faults and threading dislocations were observed. Energy dispersive X-ray spectroscopy (EDXS) analysis was performed along the InGaN/GaN quantum dot active region. The HAADF image and EDXS analysis of the quantum dot active region is further illustrated in FIG. 3 in second image 300B, showing the signal variations of Ga and In (dips and peaks) across the active region (quantum dots) along the growth direction (c-axis). The HR-TEM image of the tunnel junction is illustrated in FIG. 3 in third image 300C. It can be seen that the thickness of the Al layer is ~2 nm. EDXS analysis was further performed to study the compositional variations of the $n^{++}$-GaN/Al/$p^{++}$-GaN tunnel junction. An EDXS point profile taken in the vicinity of the Al-layer provided unambiguous evidence for the presence of Al. The thin Al layer is surrounded by relatively thick p- and n-GaN. Even though the beam was directed toward the Al-layer, Ga and N signals were also detected from the surrounding GaN layers due to the enlarged beam size. It is worthwhile mentioning that due to the high atomic number (atom density) of Ga compared to Al-layer (p-GaN region) shows no measureable trace of Al (third schematic 300C in FIG. 3).

Nanowire LED Processing

Figure 4:
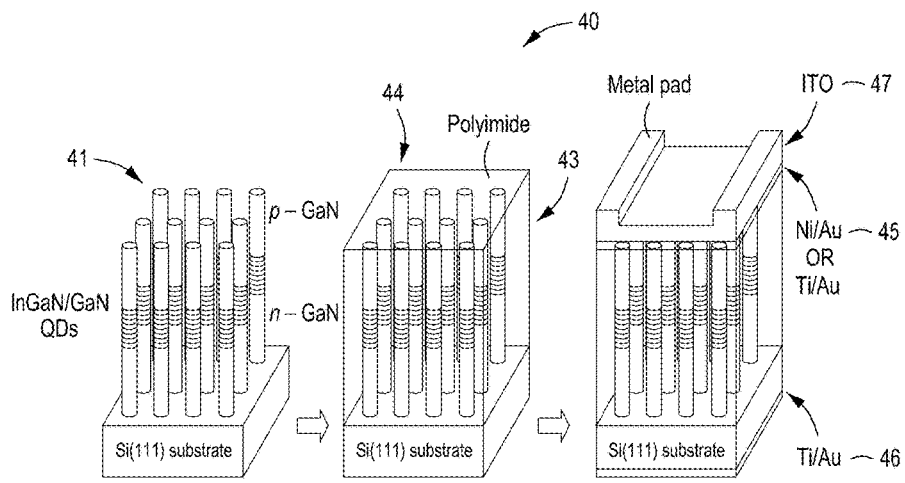
FIG. 4 depicts schematically the fabrication process of nanowire LEDs comprising as grown nanowires on Si substrate, polyimide spin-coating, polyimide etch-back, p-side contact metallization, n-side contact metallization, and indium tin oxide (ITO) transparent conductive electrode. In the design of these nanowire structures the active region of each LED includes ten self-organized InGaN/GaN quantum dots.

Subsequent to the growth of the nanowire arrays with or without Al-based tunnel junctions or tunnel junctions at all the arrays were processed to form LEDs. This processing 40 begins, as depicted in FIG. 4, with the nanowire arrays 41 being first planarized 44 using a polyimide resist layer 43, followed by contact metallization and thermal annealing. For LED-A and LED-B, a Ti/Au (8 nm/8 nm) layer 45 and a Ti/Au layer 46 (20 nm/120 nm) were deposited on the nanowire upper surface and the backside of the Si substrate as the top metal contact layer 45 and the back metal contact layer 46, respectively. For LED-C, the top metal contact includes a layer of Ni/Au (8 nm/8 nm) metallization or a layer of Ti/Au metallization. A 120 nm indium tin oxide (ITO) layer 47 was subsequently deposited on the top surface of layer 45 to serve as a transparent current spreading layer. Details of the LED fabrication process have been described elsewhere, see for example Nguyen et al. in "p-Type Modulation Doped InGaN/GaN dot-in-a-wire White Light Emitting Diodes Monolithically Grown on Si(111)" (Nano. Lett., Vol. 11. No. 5, pp 1919-1924).

Nanowire LED Characterization

Current-voltage characteristics of the nanowire LEDs were measured under continuous wave biasing conditions at room temperature. During the measurements, a negative bias was applied on the top surface for n-GaN up LEDs (LED-A and LED-B). As such, for each of LED-A and LED-B these were forward biased and the tunnel junction was reverse biased. Conversely, a positive bias was applied on the top surface for p-GaN up device (LED-C, without the use of tunnel junction).

Figure 5:
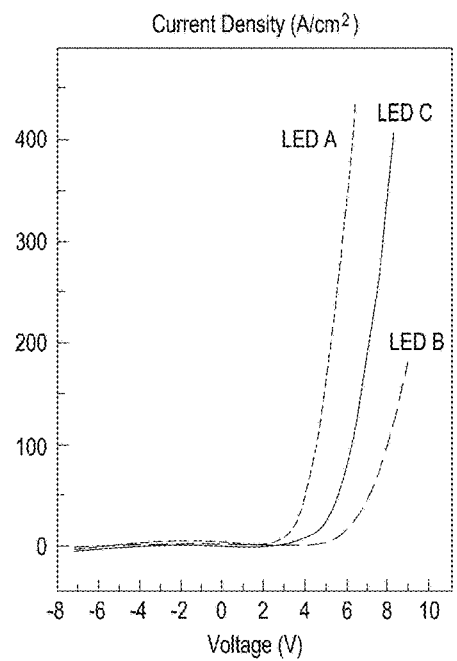
FIG. 5 depicts I-V characteristics of the Al-interconnect tunnel junction (TJ) dot-in-a-wire LED (LED-A) according to an embodiment of the invention, a $n^{++}$-GaN/$p^{++}$-GaN TJ dot-in-a-wire LED (LED-B) according to an embodiment of the invention, and a prior art nanowire dot-in-a-wire LED (LED-C) without any TJ.
Figure 6:
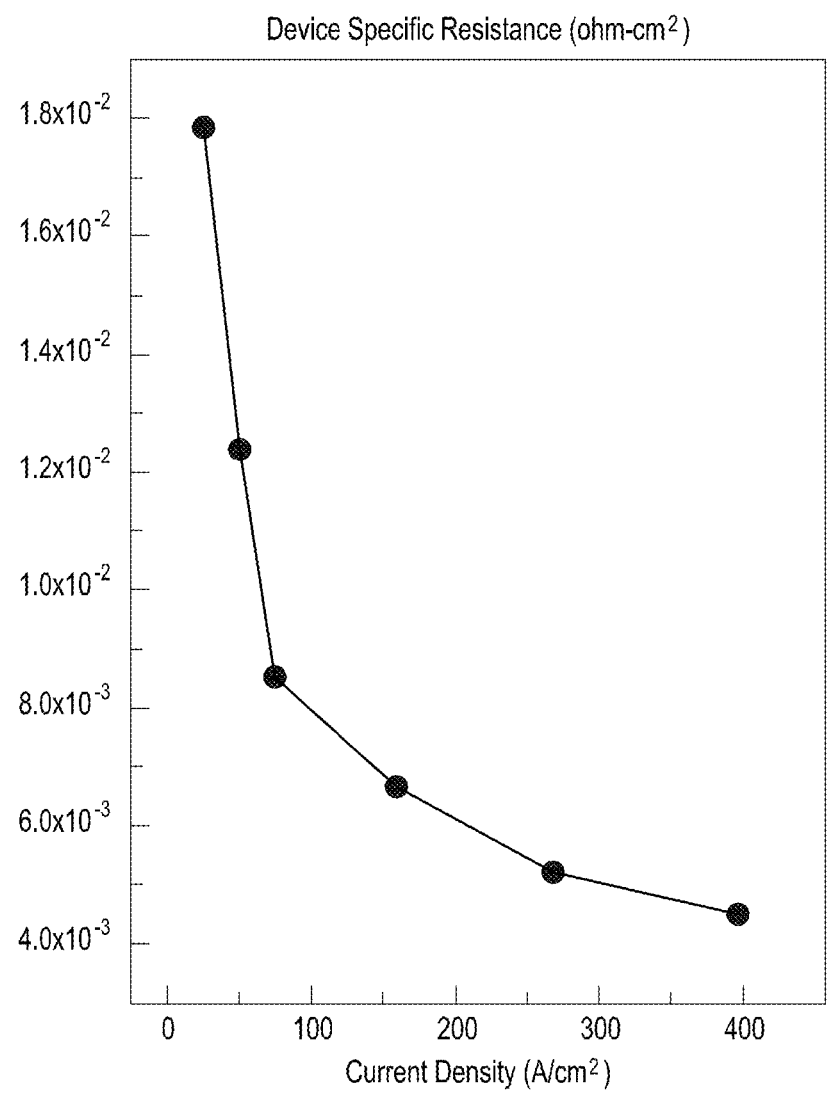
FIG. 6 depicts the normalized device specific resistance versus current density for an Al-interconnect tunnel junction (TJ) dot-in-a-wire LED (LED-A) according to an embodiment.

Now referring to FIG. 5 the current density versus voltage characteristics of the LEDs are depicted. LED-A, being the LED with an Al tunnel junction exhibits a clear rectifying characteristics with a sharp turn-on voltage of ~2.9V. The device area size is 500 μm×500 μm, and the nanowire filling factor is ~30%. The device specific resistivity estimated from the linear portion of the forward characteristics is ~$4\times10^{-3}\Omega\cdot cm^2$ at 400 A/cm². A plot of the normalized device specific resistance versus current density for LED-A is depicted in FIG. 6. Both the turn-on voltage and resistance is much smaller than that of the conventional nanowire LEDs grown and fabricated under similar conditions but without the use of tunnel junction (LED-C). For comparison, the $n^{++}$-GaN/$p^{++}$-GaN tunnel junction LED (LED-B) exhibited significantly larger turn-on voltage ~5.5V and higher resistivity ~$5\times10^{-2}\Omega\cdot cm^2$, due to the wide depletion region width formed between $n^{++}$-GaN and $p^{++}$-GaN regions and the resulting low tunneling efficiency. It is also worthwhile mentioning that the specific resistivity of ~$4\times10^{-3}\Omega\cdot cm^2$ for LED-A includes not only the Al tunnel junction resistance, but also the contact resistance and series resistance of the p- and n-GaN layers. In addition, the device resistance is further limited by the presence of a $SiN_X$ layer at the Si and GaN nanowire interface and non-uniform contact to the nanowire arrays due to variations of nanowire heights. Taking these factors into account, the specific resistivity for the Al tunnel junction is estimated to be $1\times10^{-3}\Omega\cdot cm^2$, or lower. Amongst the reasons for this are:

1) During the MBE growth of GaN nanowires on Si, ~2-3 nm of amorphous $SiN_X$ was formed at the nanowire- Si substrate interface, which could lead to relatively high resistance of nanowire LEDs; and
2) During the device fabrication process, a polymer resist layer was used to passivate and planarize the nanowires. Due to variations in the height of spontaneously formed nanowire arrays, some of the nanowire top surfaces are covered by some residual polymer, which leads to increased device resistance.

These issues can be potentially addressed by developing highly uniform nanowire arrays using the technique of selective area growth. Taking these factors into account, we estimated that the specific resistivity for the Al tunnel junction is in the range of ~$1\times10^{-3}\Omega\cdot cm^2$, or smaller. Specific resistivity values in the range of $10^{-4}\Omega\cdot cm^2$ to $10^{-2}\Omega\cdot cm^2$ have been previously reported in GaN-based planar tunnel junction devices as evidenced from Table 1 below. Given the identical design, growth and fabrication processes for the three LEDs within the work by the inventors, the significantly reduced turn-on voltage and resistance of LED-A provides unambiguous evidence that the $n^{++}$-GaN/Al/$p^{++}$-GaN can serve as a low resistivity tunnel junction.

TABLE 1

Summary of Specific Resistance Values of Prior Art Tunnel Junction Devices versus Embodiment of the Invention

| Ref. | Tunnel Junction (TJ) Material | ($\Omega \cdot cm^2$) | Device ($\Omega \cdot cm^2$) | Structure | Method |
|---|---|---|---|---|---|
| 1 | InGaN/GaN | $5 \times 10^{-4}$ | $2 \times 10^{-2}$ | Planar, TJ LED | PA-MBE |
| 2 | GdN/GaN | $1.3 \times 10^{-3}$ | N/A | Planar, TJ p-n device | PA-MBE |
| 3 | $p^{++}$-GaN/$n^{++}$-GaN | $22.5 \times 10^{-2}$ | N/A | Planar TJ device | PA-MBE |
| 4 | InGaN/GaN | $6.05 \times 10^{-3}$ | $2.38 \times 10^{-2}$ | Planar TJ LED | MOCVD |
| 5 | AlGaN/InGaN | $1.95 \times 10^{-3}$ | $1.97 \times 10^{-2}$ | Planar TJ LED | MOCVD |
| 6 | InGaN/GaN | $5 \times 10^{-4}$ | $0.3 \times 10^{-2}$ | Planar, cascaded TJ LED | PA-MBE |
| 7 | $p^{++}$-GaN/$n^{++}$-GaN | N/A | $3.7 \times 10^{-4}$ | Planar, TJ LED | Ammonia MBE |
| 8 | InGaN/GaN | N/A | $3 \times 10^{-2}$ | Nanowire, TJ LED | PA-MBE |
| 9 | Al/GaN | ~$10^{-3}$ | $0.4 \times 10^{-2}$ | Nanowire, TJ LED | PA-MBE |
| 10 | InGaN/GaN | ~$10^{-4}$ | N/A | Planar, TJ device | PA-MBE |

1: APL, 105, 141104, 2014
2: Nano Lett, 13, 2570-2575, 2013
3: Nano Lett, 13, 2570-2575, 2013
4: IEEE EDL, 36, 4, 2015
5: IEEE JOE, 51, 8, 2015
6: APEX, 8, 082103, 2015
7: APL, 107, 051107, 2015
8: Nano Lett., 15, 10, 6696, 2015
9: Inventors, this work
10: APL, 99, 233504, 2011

Figure 7B:
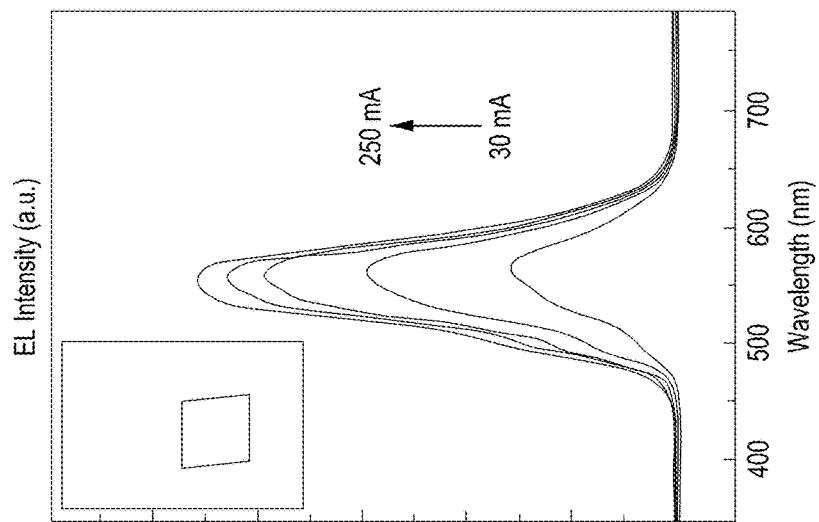
FIG. 7B depicts electroluminescence (EL) spectra of the Al-interconnect tunnel junction (TJ) dot-in-a-wire LED (LED-A) according to an embodiment of the invention under pulsed biasing condition (10% duty cycle) together with, see inset, an optical micrograph of the Al-interconnect tunnel junction (TJ) dot-in-a-wire LED (LED-A) showing strong green light emission.
Figure 7A:
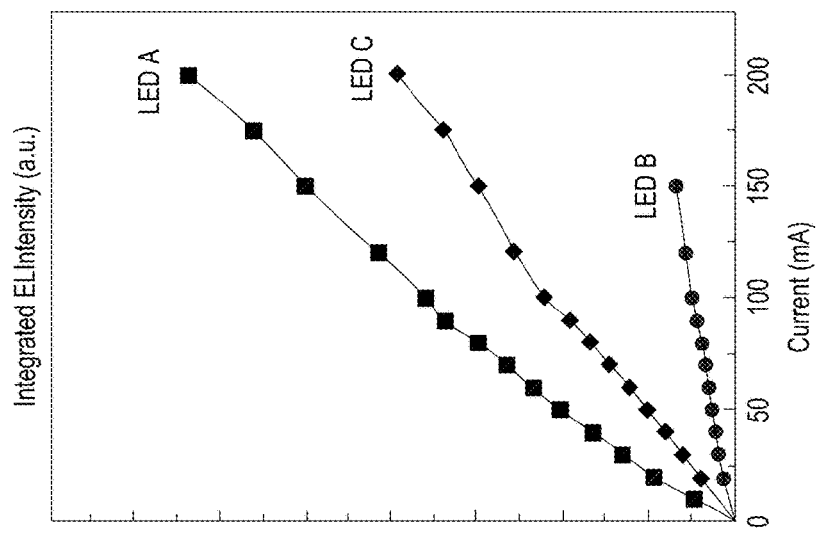
FIG. 7A depicts L-I characteristics of the Al-interconnect tunnel junction (TJ) dot-in-a-wire LED (LED-A) according to an embodiment, a $n^{++}$-GaN/$p^{++}$-GaN TJ dot-in-a-wire LED (LED-B) according to an embodiment, and a prior art nanowire dot-in-a-wire LED (LED-C) without any TJ.

The Al tunnel junction LED also showed significantly improved light intensity compared to the conventional nanowire device (LED-C) and n$^{++}$-GaN/p$^{++}$-GaN tunnel junction device (LED-B) as depicted in FIG. 7A. These devices were measured under pulsed bias (10% duty cycle) to minimize junction heating effect. The significantly improved light intensity is largely due to the efficient tunnel injection of holes into the active region. The output spectra of LED-A measured from 30 mA to 250 mA are shown in FIG. 7B. An optical micrograph of the device is shown in the inset of FIG. 7B.

Figure 7D:
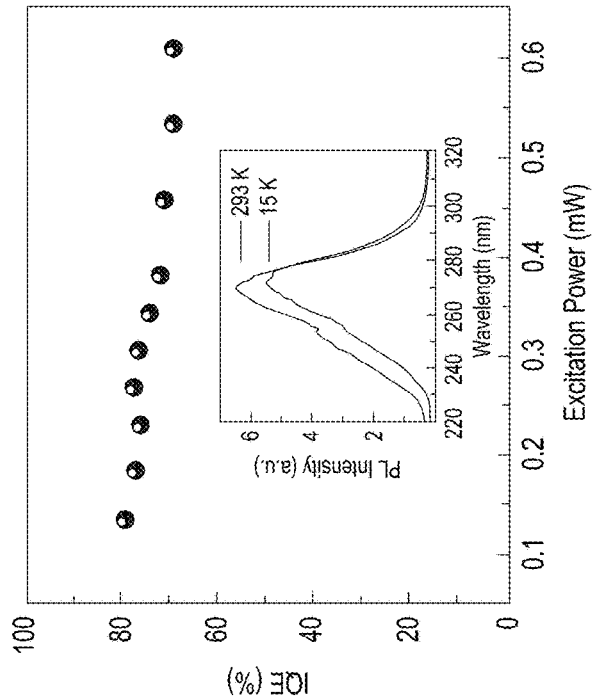
FIG. 7D depicts internal quantum efficiency versus excitation power measured at room temperature for the AlGaN tunnel junction nanowire LED heterostructure. The inset of FIG. 7D shows the photoluminescence (PL) spectra measured under an excitation power of 0.13 mW at temperatures of 293 K and 15 K.
Figure 7C:
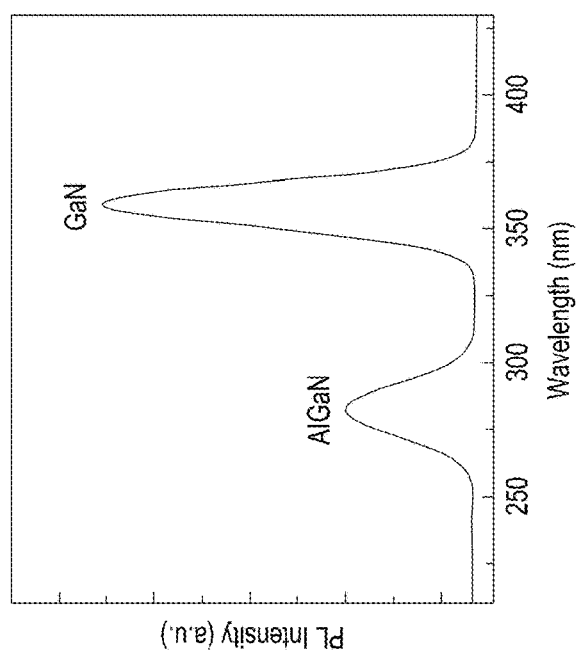
FIG. 7C depicts room-temperature photoluminescence spectrum

Shown in FIG. 7C, the nanowire heterostructure exhibits strong emission at ~280 nm at room temperature. Emission from the underlying GaN nanowire segment can also be observed. The internal quantum efficiency (IQE) is estimated by comparing the photoluminescence emission intensity at room temperature with that measured at low temperature (20 K).

Shown in FIG. 7D, a very high internal quantum efficiency (IQE) ~80% is obtained at room temperature. Such high IQE surpasses that of conventional AlGaN quantum wells in the deep ultraviolet (UV) wavelength range (200-280 nm). The inset of FIG. 7D shows the photoluminescence (PL) spectra at temperatures of 293 K and 15 K under an excitation power of 0.13 mW. However, the photoluminescence efficiency depends on the excitation power and other nonradiative mechanisms at low temperature. In this context, it may be valuable to derive the accurate internal quantum efficiency (IQE) over a broad range of excitation power. As can been seen in the FIG. 7D, the internal quantum efficiency (IQE) stays in the range of 70% to 80% over a large range of excitation power.

The high-luminescene efficiency is directly related to the significantly reduced defect densities in AlGaN nanowires and the formation of an Al-rich AlGaN shell structure that minimizes nonradiative surface recombination.

Figure 8A:
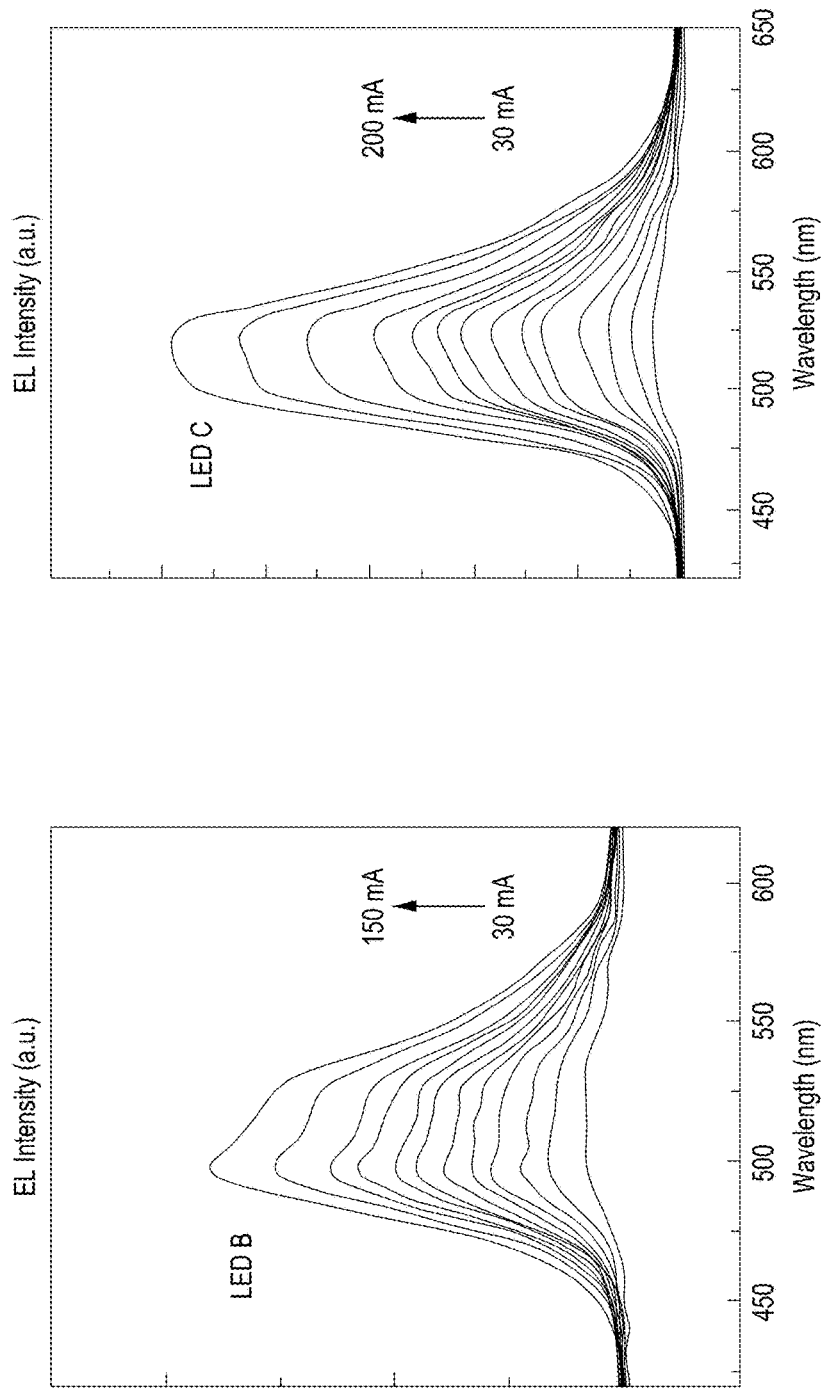
FIG. 8A depicts electroluminescence (EL) spectra of $n^{++}$-GaN/$p^{++}$-GaN TJ dot-in-a-wire LED (LED-B) according to an embodiment, and a prior art nanowire dot-in-a-wire LED (LED-C) without any TJ under pulsed biasing condition (10% duty cycle).
Figure 8B:
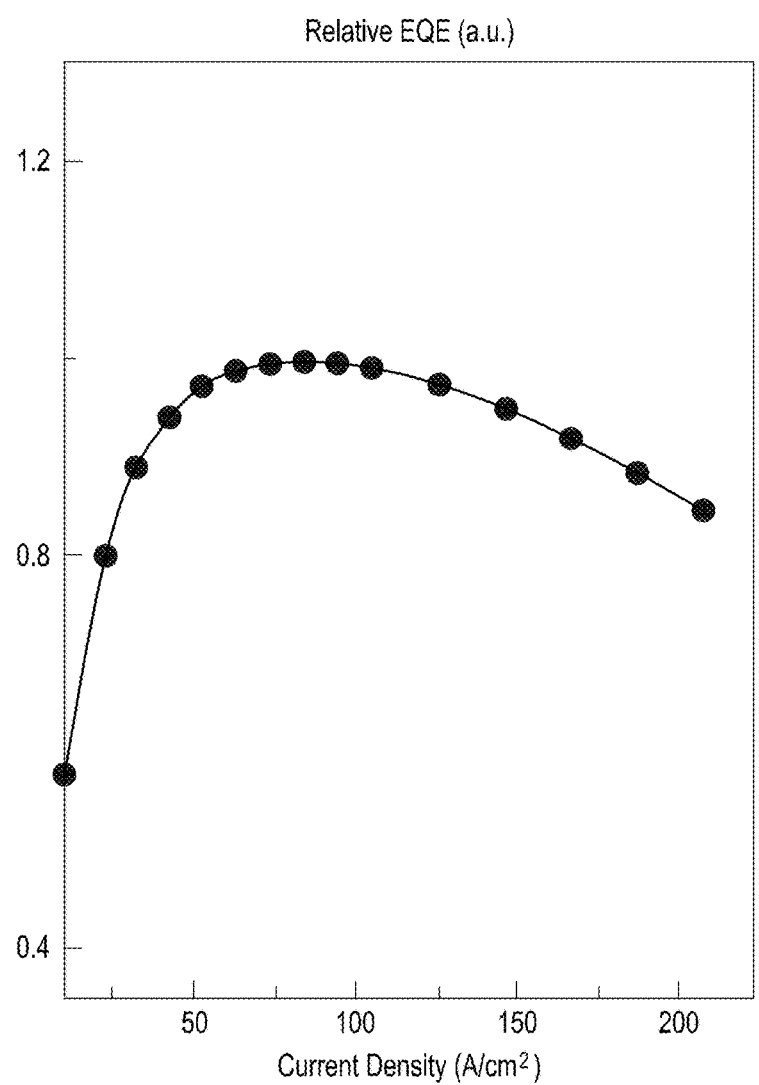
FIG. 8B depicts the relative external quantum efficiency (EQE) of the Al-interconnect tunnel junction (TJ) dot-in-a-wire LED (LED-A) according to an embodiment under CW biasing condition.

Electroluminescence (EL) spectra of LED-B and LED-C are also shown in FIG. 8A under pulsed biasing condition (10% duty cycle). The measured relative external quantum efficiency (EQE) of the Al-tunnel junction nanowire LEDs (LED-A) measured under CW biasing condition is shown in FIG. 8B. During these measurements there was no noticeable shift in the peak position with increasing current. Such highly stable emission characteristics are a direct consequence of the highly efficient and uniform hole injection in the quantum dot active region. It is further expected that, by suppressing non-radiative surface recombination with the incorporation of core-shell quantum dot active regions, that the Al tunnel junction nanowire LEDs can lead to high power operation.

Figure 8D:
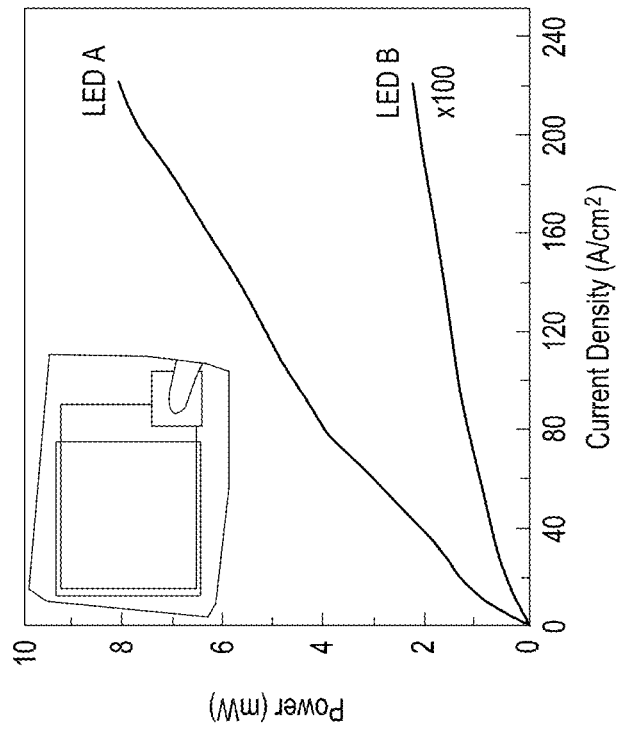
FIG. 8D depicts output power versus injection current for Al tunnel junction AlGaN UV LED (LED A) and standard p-i-n AlGaN UV LED (LED B) under pulsed biasing (2% duty cycle). The inset shows an optical image of LED A under an injection current of 8 A/cm$^2$.
Figure 8C:
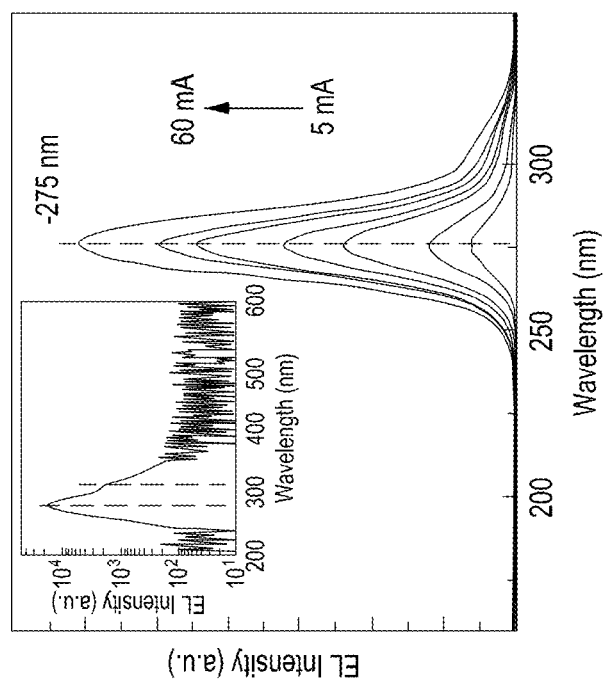
FIG. 8C depicts electroluminescence (EL) spectra of the Al tunnel junction AlGaN UV LED (LED A) under continuous wave (CW) biasing condition. The inset shows the electroluminescence (EL) spectrum in log scale.

FIG. 8C shows the electroluminescence (EL) spectra measured under various injection currents under continuous wave (CW) biasing condition for LED A. A relatively narrow emission peak centered at 275 nm was measured. The spectral line width (full width at half-maximum) is ~18 nm, which is comparable to that measured from AlGaN quantum wells in this wavelength range. No significant shift in the emission wavelength was measured with increasing injection current, which is directly related to the use of double heterostructures.

Significantly, defect-related emission in the UV or visible spectral range that was commonly observed in conventional AlGaN quantum wells is absent in the presented AlGaN nanowires, shown in the inset of FIG. 8C.

Output power of nanowire LEDs was measured directly on wafer without any packaging. FIG. 8D shows an output power exceeding 8 mW which was measured under pulsed biasing condition. Also shown in FIG. 8D is the output power versus injection current for the standard p-i-n nanowire device (LED B), which exhibits a maximum output power in the range of 20 µw to 30 µW.

Given the similar optical properties of both nanowire devices under optical pumping, the drastically improved output power for LED A is attributed to the significantly enhanced hole transport and injection into the device active region, due to the incorporation of Al tunnel junction, and the elimination of resistive and absorptive p-GaN contact layer.

Figure 8E:
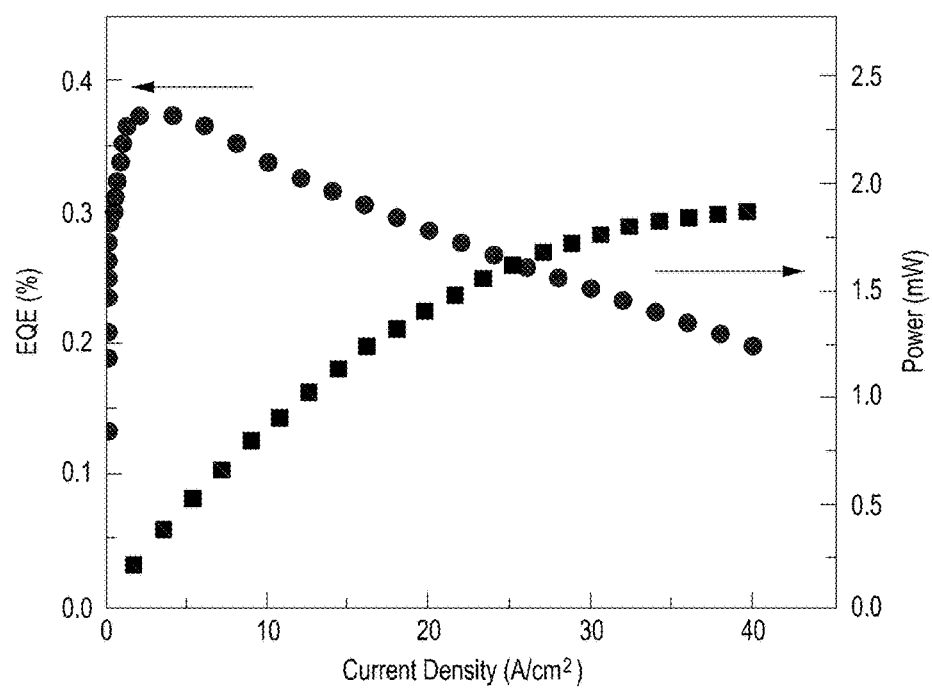
FIG. 8E depicts external quantum efficiency (EQE) and output power of Al tunnel junction AlGaN UV LED under continuous wave (CW) condition.

FIG. 8E shows the variations of the external quantum efficiency (EQE) of Al tunnel junction device (LED A) versus current under continuous wave (CW) operation. It is seen that that the external quantum efficiency (EQE) first shows an increasing trend with current and reaches a peak value of ~0.4% at 2 A/cm$^2$, followed by a drop with further increasing current. The measured external quantum efficiency (EQE) of 0.4% is nearly a factor of 50 to 100 times higher than previously reported LEDs operating in the UV-B or UV-C bands.

The efficiency droop can be minimized by incorporating an AlGaN electron blocking layer and by p-type modulation doping to enhance the hole injection and transport in the active region. The maximum wall-plug efficiency (WPE) was ~0.3%.

It is observed that nearly dislocation-free Al-rich AlGaN nanowire heterostructures can be formed on an epitaxial Al tunnel junction, using the present techniques. The resulting core-shell nanowire arrays exhibit high luminescence efficiency of ~80% in the UV-C band at room temperature.

Such p-(Al)GaN contact-free deep UV LEDs showed nearly one order of magnitude reduction in the device resistance and more than two orders of magnitude enhancement in the output power.

The device performance can be further improved by optimizing the tunnel junction and device active region, including the use of quantum dots or quantum disks and the incorporation of electron blocking layer.

It is further envisioned that the Al tunnel junction with optimized design can be exploited to significantly enhance the light reflection and extraction, which together with a precise control of the nanowire size and spacing can lead to deep UV LED devices with significantly improved performance.

The present techniques have been used to develop a low resistance Al tunnel junction integrated dot-in-a-wire LEDs, enabling p- contact free devices with significantly improved hole injection efficiency. Compared to prior art polarization engineered tunnel junctions, the novel and inventive Al tunnel junction completely eliminates the use of either a low band gap InGaN or a large bandgap Al(Ga)N layer in the tunnel junction design which has been shown in the prior art to result in undesired optical absorption and/or high voltage loss. Such an Al tunnel junction may also be implemented in either N-face or Ga-face III-nitride quantum well and nanowire LEDs.

The novel and inventive Al tunnel junction also offers promise for applications in the emerging non-polar and semi-polar GaN optoelectronic devices. Moreover, the seamless integration of defect-free nanowire structures with various metal layers offers a unique approach for achieving high performance nanoscale electronic and photonic devices which have hitherto not been previously possible.

FIGS. 9 to 11 depict example schematics of enhanced nanowire devices. FIG. 9 depicts the patterning of a metallized layer as a template for nanowire growth and enhanced functionality/performance of the nanowire devices. As depicted, prior to growth of the nanowires 930 a metallic layer 920 is deposited upon a substrate 910 and patterned with openings such that during the nanowire growth phase the nanowires grow at these opening locations. Subsequently, the metallic layer 920 may act as a reflector for the nanowire based devices such as an optical source or a solar cell, for example.

FIG. 10 depicts the integration of metal layers within semiconductor nanowires for enhanced photon management and relaxed strain wherein a stacked sequence of semiconductor layers 1010A to 1010E respectively wherein each sequential pair of semiconductor layers are separated by a metal layer 1020. Each metal layer 1020 may be identical or formed from two or more different metals. The semiconductor layers 1010A to 1010E respectively may be identical or formed from two or more semiconductor alloys. Alternatively, in some embodiments of the invention a transparent metallic oxide, such as indium tin oxide, may be employed replacing one or more metallic electrodes. Accordingly, the sequence of alternative semiconductor and metallic layers allows for strain within the nanowire to be relaxed at these semiconductor-metal interfaces as well as supporting optical pumping methodologies for nanowire based photonic devices wherein a pair of metallic reflectors enable optical feedback.

This concept is extended in FIG. 11 wherein the nanowire structure of alternating semiconductor nanowire segments 1110A to 1110E respectively and metal layers 1120 are augmented with quantum structures 1130A to 1130D respectively, for example quantum dot structures or quantum dot-in-a-wire structures. Each metal layer 1120 may be identical or formed from two or more different metals. The semiconductor nanowire segments 1110A to 1110E respectively may be identical or formed from two or more semiconductor alloys. Similarly, the quantum structures 1130A to 1130D respectively may be identical or formed from two or more semiconductor alloys with common dopant and/or doping levels or with two or more dopants and/or doping levels. Accordingly, optical pumping of the quantum dots may be supported by such embodiments of the invention.

Whilst example embodiments have been presented with respect to Al and GaN, it will be evident to one of skill in the art that with other semiconductors that other metals may provide the same desired combination of quasi-ohmic contacts between the metal layer and the two semiconductor alloys either side of it forming the overall tunnel junction. In these embodiments, the metallic layer may directly or in combination with doping yield the appropriate energy level structure(s) to support carrier transport from one semiconductor to the metallic layer and therein the metallic layer to the second semiconductor. In this manner, the need for polarization engineering may be eliminated and/or reduced in order to provide a sufficiently narrow depletion region for efficient tunneling.

Whilst example embodiments have been described with respect to a metallic element for the metal layer within the tunnel junction, it would be evident to one of skill in the art that the metal may alternatively be an alloy or a combination of metals The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A semiconductor emitter comprising:
a tunnel junction comprising a metallic layer disposed between a first semiconductor alloy and a second semiconductor alloy; wherein the metallic layer also acts as a reflector within the semiconductor emitter, wherein the semiconductor emitter is a nanowire and the tunnel junction is part of the nanowire.

2. A semiconductor device comprising a tunnel junction comprising a first semiconductor alloy of a first composition, and a layer of a metal of a second composition, wherein the semiconductor device is a nanowire.

3. The semiconductor device according to claim 2, wherein the layer of the metal enhances carrier transport to and from at least one of the first semiconductor alloy and a second semiconductor alloy.

4. The semiconductor device according to claim 3, wherein the first semiconductor alloy is n++-GaN; the second semiconductor alloy is p++-GaN; and the layer of the metal is a metallic layer comprising Al.

5. The semiconductor device according to claim 2, wherein the layer of the metal forms at least one of a quasi-ohmic contact and an ohmic contact with at least one of the first semiconductor alloy and a second semiconductor alloy.

6. The semiconductor device according to claim 5, wherein the layer of metal is positioned in the semiconductor device to form semiconductor/metal/semiconductor epitaxial layers exhibiting quasi-ohmic or ohmic contact characteristics and to enable efficient inter-band conduction from a first p-type semiconductor alloy to a second n-type semiconductor alloy, through the layer of metal.

7. The semiconductor device according to claim 6, wherein the layer of metal is an Al layer interconnect, the first p-type semiconductor alloy is a p++-GaN alloy, the second n-type semiconductor alloy is a n++-GaN alloy, and the semiconductor/metal/semiconductor epitaxial layers are n++-GaN/Al/p++-GaN epitaxial layers.

8. The semiconductor device according to claim 2, wherein the layer of metal is a metallic layer configured to provide an optical reflector for photons emitted from the semiconductor device.

9. A semiconductor device comprising:
a plurality of semiconductor layers, each semiconductor layer of the plurality of semiconductor layers having a composition; and
a plurality of metallic layers, each metallic layer of the plurality of metallic layers comprising a metal and disposed between a pair of semiconductor layers of the plurality of semiconductor layers, wherein a metallic layer of the plurality of metallic layers in combination with its associated pair of semiconductor layers of the plurality of semiconductor layers comprises a tunnel junction, and wherein the semiconductor device comprises a plurality of nanowires.

10. The semiconductor device according to claim 9, wherein a portion of the semiconductor device is configured to be optically pumped.

11. The semiconductor device according to claim 9, wherein a semiconductor layer of the plurality of semiconductor layers further comprises a quantum structure.

12. A device comprising:
 a substrate;
 a first metallic layer disposed on a surface of the substrate; and
 a semiconductor device comprising a plurality of nanowires disposed at locations on the substrate, the locations defined by openings within the first metallic layer, wherein the first metallic layer acts as an optical reflector for the semiconductor device, wherein the plurality of nanowires comprise a nanowire comprising a tunnel junction, and wherein the tunnel junction comprises a second metallic layer disposed between a first semiconductor alloy and a second semiconductor alloy.

13. The device according to claim 12, wherein the semiconductor device is a type of device selected from the group consisting of: an optical emitter, a photodetector, and a solar cell.

* * * * *